(12) United States Patent
Hong et al.

(10) Patent No.: US 10,867,818 B2
(45) Date of Patent: Dec. 15, 2020

(54) WAFER LEVEL DISPENSER

(71) Applicant: PROTEC CO., LTD., Gyeonggi-do (KR)

(72) Inventors: Seung Min Hong, Gyeonggi-do (KR); Hee Joong Cho, Seoul (KR)

(73) Assignee: PROTEC CO., LTD., Gyeonggi-do (KR)

( * ) Notice: Subject to any disclaimer, the term of this patent is extended or adjusted under 35 U.S.C. 154(b) by 82 days.

(21) Appl. No.: 16/378,528

(22) Filed: Apr. 8, 2019

(65) Prior Publication Data

US 2019/0311925 A1 Oct. 10, 2019

(30) Foreign Application Priority Data

Apr. 9, 2018 (KR) .................. 10-2018-0040810
Apr. 30, 2018 (KR) .................. 10-2018-0049892

(51) Int. Cl.
*H01L 21/67* (2006.01)
*H01L 21/56* (2006.01)

(52) U.S. Cl.
CPC ...... *H01L 21/67126* (2013.01); *H01L 21/563* (2013.01)

(58) Field of Classification Search
None
See application file for complete search history.

(56) References Cited

U.S. PATENT DOCUMENTS

| 6,855,030 | B2 | 2/2005 | Halley | |
|---|---|---|---|---|
| 7,896,049 | B2 | 3/2011 | Yamamoto | |
| 2001/0050041 | A1* | 12/2001 | Reardon | H01L 21/6715 118/52 |
| 2003/0137043 | A1 | 7/2003 | Wang et al. | |
| 2006/0048710 | A1* | 3/2006 | Horiguchi | H01L 21/67103 118/725 |
| 2008/0064184 | A1* | 3/2008 | Lackner | H01L 21/30604 438/459 |
| 2015/0159642 | A1* | 6/2015 | Sasa | F04B 43/1276 137/544 |

FOREIGN PATENT DOCUMENTS

| KR | 20040060299 | 7/2004 |
|---|---|---|
| KR | 20170113726 | 10/2017 |
| KR | 101833640 | 3/2018 |

* cited by examiner

*Primary Examiner* — Jethro M. Pence
(74) *Attorney, Agent, or Firm* — JCIPRNET

(57) ABSTRACT

Provided is a wafer level dispenser, and more particularly, a wafer level dispenser having a function of applying a viscous liquid to a semiconductor chip formed on a wafer by approaching the semiconductor chip on the wafer at various angles. According to the wafer level dispenser, a viscous liquid may be dispensed to a wafer or a semiconductor chip mounted on the wafer by adjusting an angle of a pump as desired.

12 Claims, 5 Drawing Sheets

WAFER LEVEL DISPENSER

CROSS-REFERENCE TO RELATED APPLICATION

This application claims the benefit of Korean Patent Application No. 10-2018-0040810, filed on Apr. 9, 2018 and 10-2018-0049892 filed on Apr. 30, 2018, in the Korean Intellectual Property Office, the disclosure of which is incorporated herein in its entirety by reference.

BACKGROUND

1. Field of the Invention

One or more embodiments relate to a wafer level dispenser, and more particularly, to a wafer level dispenser having a function of applying a viscous liquid to a semiconductor chip formed on a wafer by approaching the semiconductor chip on the wafer at various angles.

2. Description of the Related Art

An underfill process of applying a viscous liquid to a side surface of semiconductor chips mounted on a substrate, to fill the viscous liquid between the semiconductor chips on the substrate is widely used in a semiconductor chip manufacturing process.

Recently, a method of configuring a single system semiconductor chip by stacking a semiconductor chip formed on a wafer, on another semiconductor chip in multiple layers has been used. By directly mounting semiconductor chips on a wafer in multiple layers without using a flexible printed circuit board (FPCB), the overall size and thickness of a semiconductor device may be reduced.

Also when mounting semiconductor chips on a wafer as above, an underfill process of filling a viscous liquid between the wafer and the semiconductor chips and between the semiconductor chips that are vertically adjacent to each other is required.

Compared to an underfill process performed on a substrate on which semiconductor chips are mounted, an underfill process performed on a wafer requires higher precision and accuracy. An apparatus having a structure for effectively supporting a wafer, which has a different structure and different characteristics from a substrate and is capable of applying a viscous liquid to the wafer is required. Also, an operation of forming a dam to limit an area where a viscous liquid is applied and flows may be necessary when performing an underfill process on a wafer, and a function of effectively performing the dam forming operation is also necessary.

Also, to manufacture compact semiconductor chips to be formed on a wafer, reducing a keep out zone (KOZ) is of great importance.

A KOZ refers to an area that is additionally formed in an outer portion of an area of a semiconductor chip where electrodes or elements are formed, to perform, for example, an underfill process. As semiconductor chips have become compact, the KOZ is also to be minimized in order to design and manufacture a semiconductor chip of an even smaller size. By reducing the area of a KOZ, a compact size of a semiconductor chip may be obtained, and also, a distance between semiconductor chips may also be reduced, thereby allowing manufacture of more semiconductor chips on a wafer of an equal area.

According to an underfill process of the related art, an underfill liquid is dispensed by using a nozzle that approaches a semiconductor chip and dispenses a viscous liquid vertically from above in a vertical direction. When a nozzle approaches vertically to apply a viscous liquid in a vertical direction, it is difficult to reduce a KOZ when considering a size of droplets formed by the viscous liquid or an area where the droplets fall onto a substrate and flow.

In order to reduce a KOZ and ultimately reduce a size of a semiconductor chip, the need has been arisen for a wafer level dispenser having a function of reducing a KOZ for performing an underfill process or a dam forming operation by using a viscous resin by using a method other than modifying a type of a viscous liquid, a nozzle size, a droplet size or a method of discharging a viscous liquid.

SUMMARY

One or more embodiments include a wafer level dispenser capable of applying a viscous liquid, at various angles, to a wafer, on which semiconductor chips are formed, or to the semiconductor chips stacked on the wafer.

Additional aspects will be set forth in part in the description which follows and, in part, will be apparent from the description, or may be learned by practice of the presented embodiments.

According to one or more embodiments, a wafer level dispenser includes: a pump unit dispensing a viscous liquid; a tilt unit that is coupled to the pump unit to adjust an angle of a direction, in which the viscous liquid dispensed using the pump unit is discharged, and rotates the pump unit about a horizontal axis; a pump transporting unit coupled to the tilt unit and transporting the tilt unit; a wafer supporting unit placed below the pump unit and supporting a wafer; and a wafer rotating unit rotating the wafer supporting unit to adjust a direction of the wafer supported by the wafer supporting unit.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, a wafer level dispenser according to an embodiment of the present disclosure will be described with reference to the attached drawings.

Figure 1:
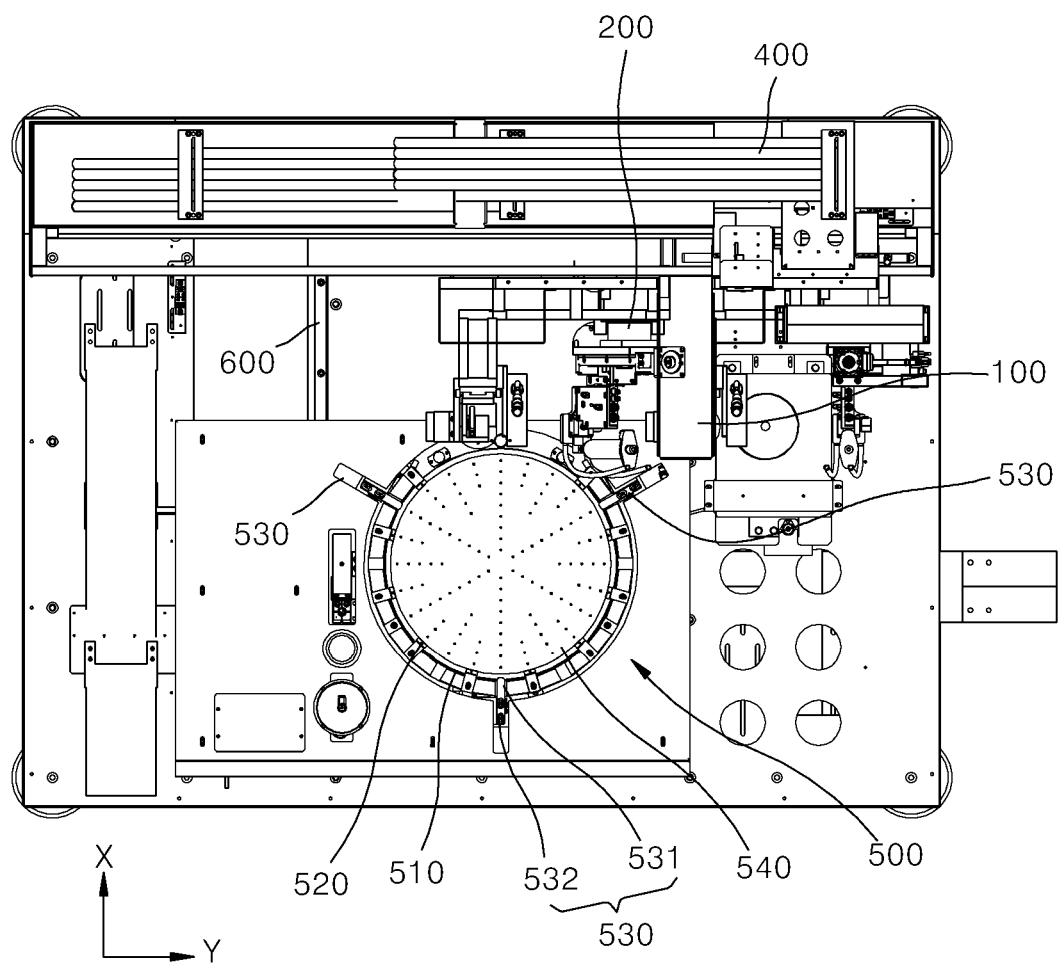
FIG. 1 is a plan view of a wafer level dispenser according to an embodiment of the present disclosure.
Figure 2:
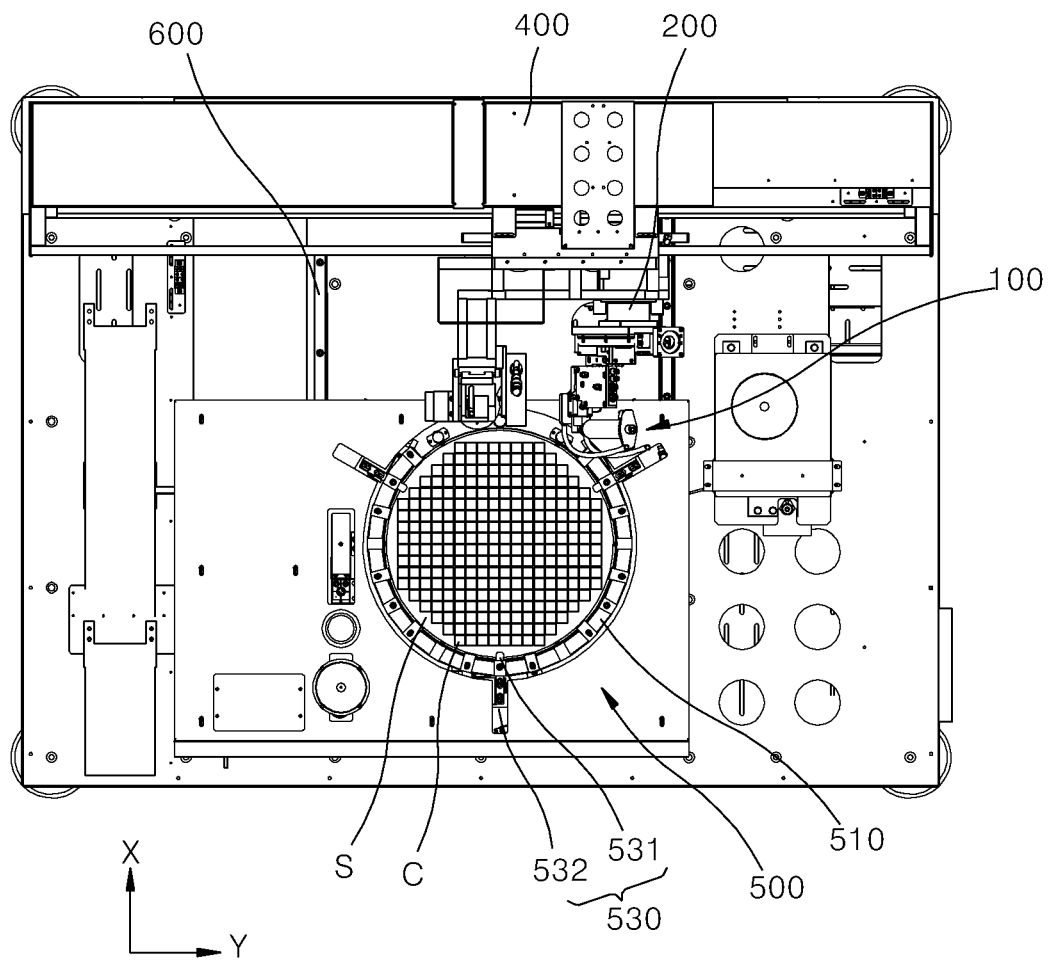
FIG. 2 is a plan view of a wafer loaded in the wafer level dispenser illustrated in FIG.
Figure 3:
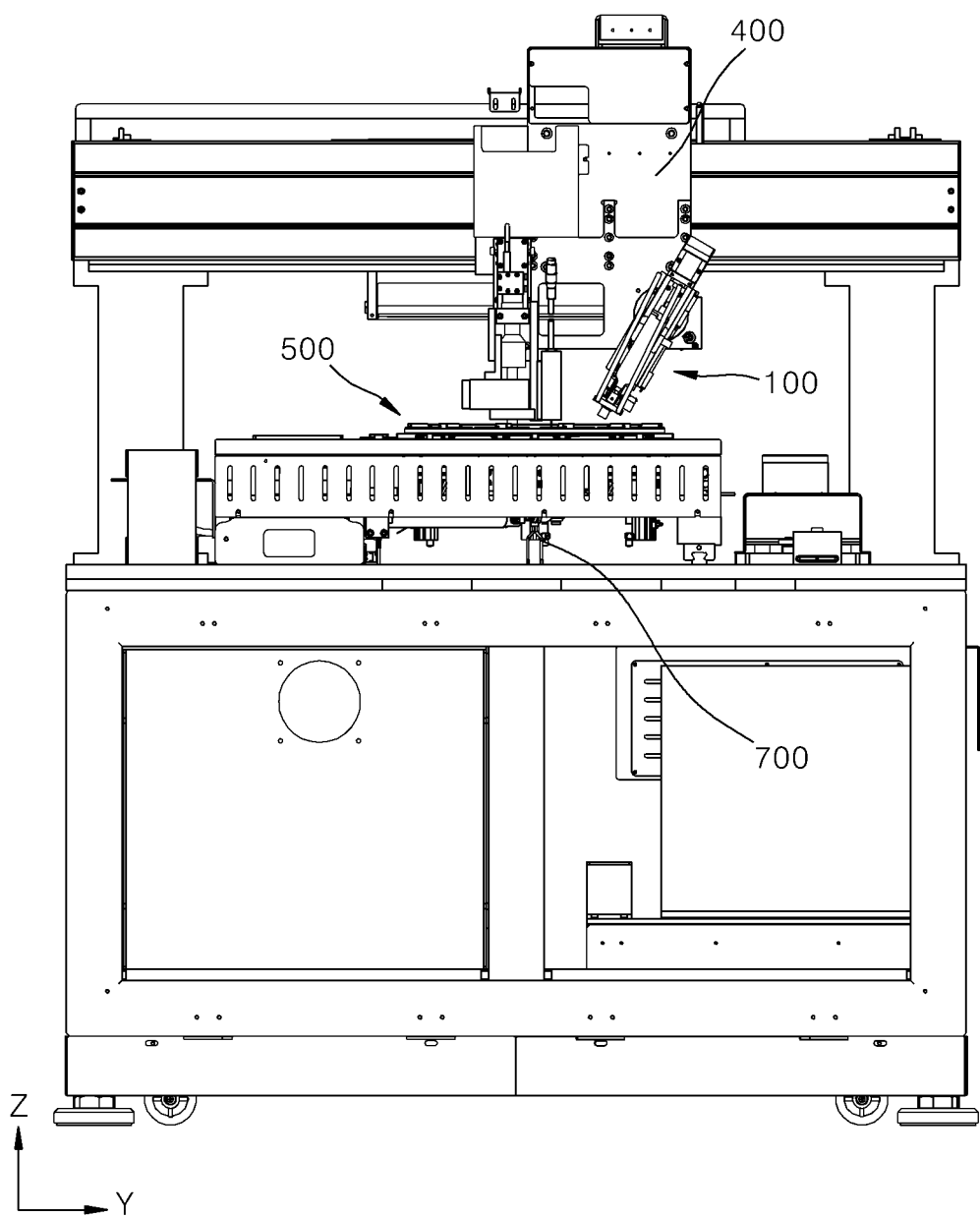
FIG. 3 is a front view of the wafer level dispenser illustrated in FIG. 2.
Figure 4:
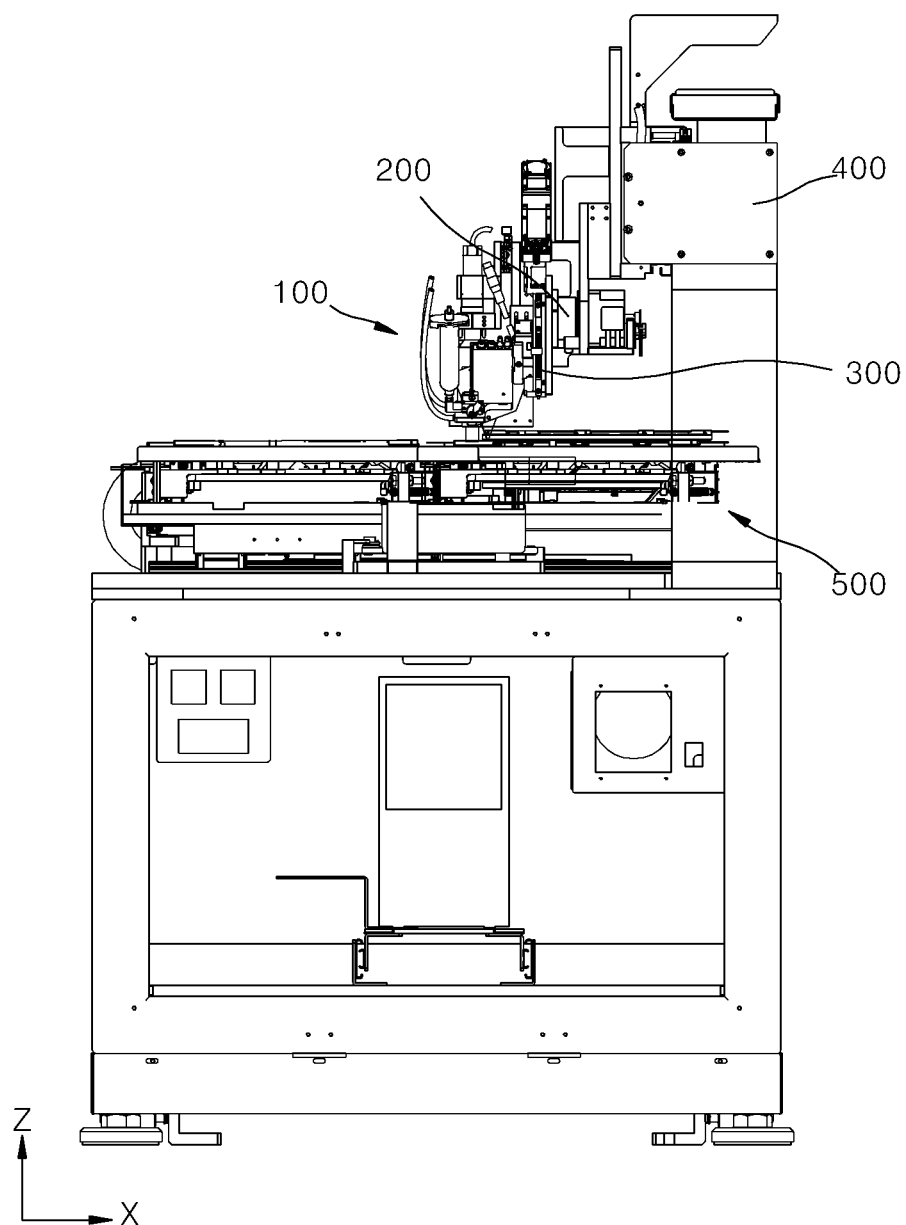
FIG. 4 is a side view of the wafer level dispenser illustrated in FIG. 2.

FIG. 1 is a plan view of a wafer level dispenser according to an embodiment of the present disclosure. FIG. 2 is a plan view of a wafer S loaded in the wafer level dispenser illustrated in FIG. 1. FIG. 3 is a front view of the wafer level dispenser illustrated in FIG. 2. FIG. 4 is a side view of the wafer level dispenser illustrated in FIG. 2.

Referring to FIGS. 1 through 4, the wafer level dispenser according to the present embodiment includes a tilt unit 200, a pump proceeding unit 300, a pump transporting unit 400, a wafer supporting unit 500, a wafer pressurizing unit 530, a wafer transporting unit 600, a wafer rotating unit 700, and a pump unit 100.

The pump unit 100 is configured to discharge a viscous liquid through a nozzle 160.

The pump unit 100 is mounted on the tilt unit 200. The tilt unit 200 rotates the pump unit 100. The tilt unit 200 rotates the pump unit 100 about a horizontal axis. With respect to FIGS. 1 and 2, the tilt unit 200 rotates the pump unit 100 about a rotational axis in an X-direction. When the tilt unit 200 rotates the pump unit 100, a direction of the nozzle 160 of the pump unit 100 is varied. Hereinafter, rotating the pump unit 100 such that a direction of the nozzle 160 of the pump unit 100 is inclined with respect to a vertical axis in a Z-direction will be defined as 'tilting.'

Referring to FIG. 4, the pump proceeding unit 300 is mounted between the pump unit 100 and the tilt unit 200. The pump proceeding unit 300 moves the pump unit 100 forward or backward. A direction in which the pump proceeding unit 300 moves the pump unit 100 forward or backward is the same as a direction of the nozzle 160 of the pump unit 100. That is, the pump proceeding unit 300 moves the pump unit 100 forward or backward in a direction in which a viscous liquid is discharged through the nozzle 160 of the pump unit 100.

The pump transporting unit 400 is coupled to the tilt unit 200. The pump transporting unit 400 transports the tilt unit 200. In the present embodiment, the pump transporting unit 400 transports the tilt unit 200 in a horizontal direction and a vertical direction. The horizontal direction refers to a Y-direction illustrated in FIGS. 1 and 2, and the vertical direction refers to a Z-direction illustrated in FIGS. 3 and 4.

The wafer supporting unit 500 is placed below the pump unit 100. The wafer supporting unit 500 is a component that holds and fixes a wafer S, to which a viscous liquid is to be dispensed using the pump unit 100. As illustrated in FIG. 1, the wafer supporting unit 500 includes a ring frame 510, a plurality of wafer supporting members 520, and a plurality of lifting members. The ring frame 510 is a ring-shaped frame. As illustrated in FIGS. 1 and 2, the ring frame 510 is ring-shaped, and portions of the ring frame 510 are opened. A wafer transporting apparatus enters the ring frame 510 through the opened portion of the ring frame 510 to transfer a wafer S to the ring frame 510.

The plurality of wafer supporting members 520 are arranged in a circumferential direction of the ring frame 510. As illustrated in FIG. 1, the plurality of wafer supporting members 520 are mounted at the ring frame 510 at positions where they may support edges of the wafer S having a disk shape. The lifting members are respectively mounted at the ring frame 510 to lift the wafer supporting members 520 with respect to the ring frame 510. Each of the wafer supporting members 520 has a vacuum adsorption hole to adsorb a lower surface of the wafer S at the edges of the wafer S.

A heating block 540 is disposed to contact the lower surface of the wafer S held on the ring frame 510. In the present embodiment, the heating block 540 is placed within the ring frame 510 as illustrated in FIG. 1. An adsorption hole is formed in the heating block 540 so as to adsorb and fix the lower surface of the wafer S. The heating block 540 is configured such that a temperature thereof is adjusted via a hot wire placed in the heating block 540. When the lower surface of the wafer S is supported by the heating block 540 while the wafer S is held on the ring frame 510, a temperature of the wafer S is maintained uniform by the heating block 540 at a preset temperature.

The wafer pressurizing unit 530 pressurizes the wafer S supported by the wafer supporting unit 500. The wafer pressurizing unit 530 includes a plurality of pressurizing members 531 and a plurality of pressurization operating members 532. The plurality of pressurizing members 531 are arranged in a circumferential direction of the ring frame 510. The plurality of pressurizing members 531 are arranged at equal angular intervals along the circumferential direction of the ring frame 510 to evenly pressurize the wafer S. In the present embodiment, three pressurizing members 531 are provided as illustrated in FIGS. 1 and 2. Also, three pressurization operating members 532 are provided in the same number as the pressurizing members 531. The pressurization operating members 532 respectively transport the pressurizing members 531 in a radial direction with respect to the ring frame 510 to lift the pressurizing members 531. The pressurization operating members 532 respectively pressurize the edges of the wafer S held on the ring frame 510 and the heating block 540 to thereby prevent bending of the wafer S. That is, as illustrated in FIG. 2, after the pressurization operating members 532 have transported the pressurizing members 531 horizontally toward a center of the ring frame 510, the pressurization operating members 532 lower the pressurizing members 531 in a vertical direction, pressing the edges of the wafer S. In contrast, when ejecting the wafer S, the pressurization operating members 532 raise the pressurizing members 531 and then pull the pressurizing members 531 back in a direction away from the center of the ring frame 510 as illustrated in FIG. 1, thereby releasing the pressure on the wafer S.

The wafer transporting unit 600 moves the wafer supporting unit 500 forward or backward in a horizontal direction along a straight path. In the present embodiment, the wafer transporting unit 600 transports the wafer supporting unit 500 in the X-direction illustrated in FIGS. 1 and 2. That is, the pump transporting unit 400 described above transports the pump unit 100 in a Y-direction, and the wafer transporting unit 600 transports the wafer supporting unit 500 in the X-direction that is orthogonal to a direction in which the pump unit 100 is transported. Through the interaction between the pump transporting unit 400 and the wafer transporting unit 600 as above, the pump unit 100 may dispense a viscous liquid to an arbitrary position on the wafer S.

The wafer rotating unit 700 rotates both the wafer supporting unit 500 and the wafer pressurizing unit 530 together. As the wafer rotating unit 700 rotates the wafer supporting unit 500, a direction of the wafer S held on the wafer supporting unit 500 is adjusted.

According to the wafer level dispenser of the present embodiment, the pump unit 100 includes a piezoelectric pump dispensing a viscous liquid by using a piezoelectric actuator.

Figure 5:
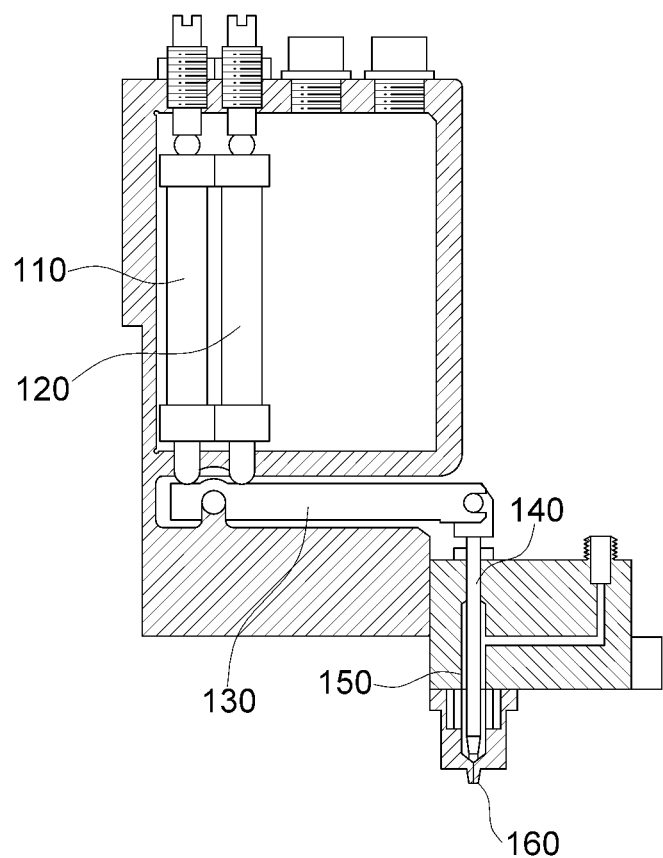
FIG. 5 is a cross-sectional view of a pump unit of the wafer level dispenser illustrated in FIGS. 1 through 4.

The pump unit 100 includes, as illustrated in FIG. 5, two piezoelectric actuators (a first piezoelectric actuator 110 and a second piezoelectric actuator 120), a lever 130, a valve rod 140, a reservoir unit 150, and a nozzle 160.

The first piezoelectric actuator 110 and the second piezoelectric actuator 120 are each formed of a piezoelectric element, a length of which is varied according to an applied voltage. In the present embodiment, multi-stack type piezoelectric actuators in which a plurality of piezoelectric elements are stacked are used as the first and second piezoelectric actuators 110 and 120. The first piezoelectric actuator 110 and the second piezoelectric actuator 120 are arranged in parallel to each other. The lever 130 is placed such that a rotational axis of the lever 130 is placed between the first piezoelectric actuator 110 and the second piezoelectric actuator 120. The lever 130 is configured to be in contact with the two piezoelectric actuators 110 and 120, thereby rotating according to a variation in the lengths of the first and second piezoelectric actuators 110 and 120. The valve rod 140 is connected to the lever 130 and moved forward or backward according to rotation of the lever 130. The reservoir unit 150 stores a viscous liquid. The valve rod 140 is inserted into the reservoir unit 150. The nozzle 160 is connected to the reservoir unit 150. The viscous liquid stored in the reservoir unit 150 is discharged through the nozzle 160 according to movement of the valve rod 140.

First, an operation in which the pump unit 100 dispenses a viscous liquid will be described with reference to FIG. 5.

A voltage is alternately applied to the first piezoelectric actuator 110 and the second piezoelectric actuator 120. When a voltage is applied to the first piezoelectric actuator 110, the length of the first piezoelectric actuator 110 is increased. As the length of the first piezoelectric actuator 110 is increased, the lever 130 that is in contact with the first piezoelectric actuator 110 rotates counterclockwise with respect to FIG. 5. In contrast, when a voltage is applied to the second piezoelectric actuator 120, the length of the second piezoelectric actuator 120 is increased. As the length of the second piezoelectric actuator 120 is increased, the lever 130 in contact with the second piezoelectric actuator 120 rotates clockwise with respect to FIG. 5.

When a voltage is alternately applied to the first piezoelectric actuator 110 and the second piezoelectric actuator 120 as described above, the lever 130 rotates counterclockwise or clockwise. The valve rod 140 is moved forward or backward relative to the reservoir unit 150 according to rotation of the lever 130. When the lever 130 is rotated counterclockwise, the valve rod 140 is moved backward with respect to FIG. 5. When the lever 130 is rotated clockwise, the valve rod 140 is moved forward with respect to FIG. 5. As described above, the valve rod 140 is moved forward or backward while being inserted into the reservoir unit 150. Forward or backward stroke of the valve rod 140 is transferred to the viscous liquid stored in the reservoir unit 150. Due to the stroke, the viscous liquid stored in the reservoir unit 150 is discharged out of the pump unit 100 through the nozzle 160 connected to the reservoir unit 150.

Next, an operation in which a position and angle of the pump unit 100 are adjusted will be described.

The tilt unit 200 tilts the pump unit 100 and the pump proceeding unit 300 together. As described above, the tilt unit 200 tilts the pump unit 100 about the X-direction rotational axis with respect to FIGS. 1 and 2. As the tilt unit 200 tilts the pump unit 100, an angle of a direction in which the viscous liquid dispensed using the pump unit 100 is adjusted as illustrated in FIG. 3.

When using the first and second piezoelectric actuators 110 and 120 in the pump unit 100 as in the present embodiment, the pump unit 100 requires a component such as the lever 130. Since the valve rod 140 is to be moved forward or backward by extending a displacement of the first and second piezoelectric actuators 110 and 120 which have a relatively small operational displacement, the valve rod 140 and the nozzle 160 are placed farther from a rotational center of the lever 130 than the first and second piezoelectric actuators 110 and 120. Accordingly, the nozzle 160 of the pump unit 100 that uses the first and second piezoelectric actuators 110 and 120 is placed at a position at one side offset from a center. According to the wafer level dispenser of the present embodiment, by considering the structure of the pump unit 100 in the form of a piezoelectric pump as described above, the tilt unit 200 rotates the pump unit 100 about a rotational axis of an arrangement direction of the first and second piezoelectric actuators 110 and 120. The arrangement direction of the first and second piezoelectric actuators 110 and 120 is similar to an extension direction of the lever 130. While the extension direction of the lever 130 is not fixed but is varied according to operation of the first and second piezoelectric actuators 110 and 120, in the present embodiment, the extension direction of the lever 130 approximately corresponds to the direction in which first and second piezoelectric actuators 110 and 120 are arranged. When the tilt unit 200 rotates the pump unit 100 in the direction as set above, the pump unit 100 may adjust a direction of the nozzle 160 without being greatly interfered with peripheral components and a semiconductor chip C. When the tilt unit 200 rotates the pump unit 100 about a rotational axis in a different direction from that described above, other components than the nozzle 160 below the pump unit 100 may collide with the semiconductor chip C or may be interfered with other peripheral components.

The pump proceeding unit 300 moves the pump unit 100 forward or backward in a direction in which a viscous liquid is discharged. As the tilt unit 200 tilts both the pump unit 100 and the pump proceeding unit 300 together, the pump proceeding unit 300 moves the pump unit 100 forward or backward at an angle while the pump unit 100 is being tilted.

Hereinafter, an operation of the wafer level dispenser according to the present embodiment will be described.

First, a plurality of lifting members of the wafer supporting unit 500 raise the wafer supporting members 520 relative to the ring frame 510. As the lifting members raise the wafer supporting members 520 with respect to the ring frame 510 to prepare loading of a wafer S, space for facilitating an operation of loading the wafer S may be ensured.

Next, by using various wafer transporting apparatuses known in the art, the wafer S is transferred to the wafer supporting members 520 of the wafer supporting unit 500. A wafer transporting apparatus enters the ring frame 510 through the opened portion of the ring frame 510 described above to place the wafer S on the wafer supporting members 520 of the wafer supporting unit 500. The wafer supporting members 520 adsorb a lower surface of the wafer S through the adsorption hole to support the wafer S. When the wafer S is loaded as described above, the lifting members lower the wafer supporting members 520 to place the wafer S on the ring frame 510.

When the wafer supporting members 520 are lowered, the heating block 540 disposed within the ring frame 510 and the lower surface of the wafer S come into contact with each other. In a process of dispensing a viscous liquid, it is highly important to maintain a temperature of the wafer S uniform. If the temperature of the wafer S is not maintained uniform, a viscosity or properties of the viscous liquid being dispensed may be varied, causing defects. The heating block 540 that is in contact with the lower surface of the wafer S supplies heat to the wafer S. The heating block 540 of the wafer level dispenser according to the present embodiment may maintain a uniform temperature of the wafer S during a dispensing process, thereby preventing the above-described problem. In addition, the heating block 540 adsorbs the lower surface of the wafer S through the adsorption hole. Accordingly, the wafer S may be stably fixed to the wafer supporting unit 500.

When lowering the wafer supporting members 520 is completed, the wafer pressurizing unit 530 pressurizes the wafer S against the heating block 540. As described above, the pressurization operating members 532 respectively transport the pressurizing members 531 in a radial direction of the wafer S to bring the pressurizing members 531 near the edges of the wafer S. Next, the pressurization operating members 532 respectively lower the pressurizing members 531 toward the wafer S. As the lower surface of the wafer S is supported by the wafer supporting members 520 and the heating block 540, the pressurizing members 531 pressurize the wafer S against the wafer supporting members 520 and the heating block 540. A plurality of semiconductor chips C are formed on the wafer S, and in the wafer S used in the present embodiment, a plurality of semiconductor chips C are stacked to be mounted on the wafer S. Due to this structure, when heat is applied to the wafer S, the wafer S is likely to bend by thermal deformation. Here, by pressing the edges of the wafer S against the heating block 540 by using the pressurizing members 531 and the pressurization operating members 532 as in the present embodiment, bending of the wafer S due to thermal deformation may be prevented. By preventing deformation of the wafer S, the quality of a process of dispensing a viscous liquid to the wafer S and the semiconductor chips C mounted on the wafer S may be improved.

When the wafer S is loaded to the wafer supporting unit 500 in the above-described process, an inspection apparatus detects an alignment status of the wafer S and the semiconductor chips C. The inspection apparatus measures an alignment state of the wafer S loaded to the wafer supporting unit 500 and that of the semiconductor chips C on the wafer S.

When measuring the alignment state by using the inspection apparatus is completed, a viscous liquid dispensing operation is performed. The nozzle 160 of the pump unit 100 approaches a side surface of the semiconductor chips C on the wafer S. Here, while the pump unit 100 is tilted, the pump unit 100 proceeds forward to a position where a viscous liquid is to be dispensed (between the wafer S and the semiconductor chips C or between semiconductor chips C). As illustrated in FIG. 3, the pump unit 100 approaches the side surface of the semiconductor chips C in a tilted direction with respected to the side surface of the semiconductor chips C.

When the pump unit 100 has approached sufficiently close to the side surface of the semiconductor chips C, the viscous liquid is dispensed to the semiconductor chips C through the nozzle 160 of the pump unit 100. The dispensing is performed by the wafer transporting unit 600 and the pump transporting unit 400 by changing a relative position between the wafer S and the pump unit 100. As described above, the pump transporting unit 400 transports the pump unit 100 in the Y-direction, and the wafer transporting unit 600 transports the wafer S in the X-direction. As the pump unit 100 dispenses the viscous liquid while the relative positions of the wafer S and the pump unit 100 are changed as described above, the viscous liquid may be dispensed to one side surface of each of the semiconductor chips C aligned on the wafer S. The dispensing operation as above may also be performed by calibrating positions of the semiconductor chips C and the pump unit 100 in real time by using values previously measured using the inspection apparatus.

The viscous liquid dispensed to a lower portion of the side surfaces of the semiconductor chips C flows in a space between the wafer S and the semiconductor chips C by the capillary effect to thereby be filled in the lower portion of the semiconductor chips C. As such, according to the wafer level dispenser of the present embodiment, a viscous liquid may be dispensed by directly and even more closely approaching an edge portion where the lower portion of the side surface of the semiconductor chips C and the wafer S meet, by tilting the nozzle 160 of the pump unit 100. Thus, a relatively narrow KOZ of the semiconductor chips C may be configured compared to the prior art. That is, compared to dispensing a viscous liquid to the wafer S in a vertical direction, according to the wafer level dispenser according to the present embodiment, by dispensing the viscous liquid in a tilted direction, an area where the viscous liquid flows to an outer portion of the semiconductor chips C (a KOZ) may be further reduced but the viscous liquid may smoothly flow to the lower portion of the semiconductor chips C. In addition, as the pump proceeding unit 300 moves the nozzle 160 forward or backward in a titled direction while the pump unit 100 is tilted, the possibility of collision between the nozzle 160 and the semiconductor chips C may be reduced, and at the same time, the nozzle 160 may be brought near to portions of the semiconductor chips C where the nozzle 160 should be. According to this configuration, the quality of a viscous liquid dispensing process such as an underfill process may be improved.

As illustrated in FIG. 3, by dispensing a viscous liquid while in a tilted state, an amount of the viscous liquid flowing to an outer portion of the semiconductor chips C may be reduced, and thus, a KOZ may be reduced. When the KOZ is reduced, a size of the semiconductor chips C may be reduced, and more semiconductor chips C may be placed on the wafer S and manufactured, thus increasing productivity. In addition, as a tilt angle of the nozzle 160 may be adjusted by using the tilt unit 200 based on characteristics and shape of the semiconductor chips C, a viscous liquid dispensing operation may be performed effectively.

According to circumstances, a viscous liquid may be dispensed along two or more side surfaces of the semiconductor chips C. In this case, a viscous liquid may be dispensed by rotating the wafer S by using the wafer rotating unit 700. A rotational axis of the wafer rotating unit 700 is different from that of the tilt unit 200, and thus, even when a direction of a side surface of the semiconductor chips C is changed, the viscous liquid may be dispensed while maintaining a uniform direction and tilt angle with respect to the side surface of the semiconductor chips C.

When dispensing a viscous liquid to two perpendicular side surfaces of a semiconductor chip C having a rectangular shape, the wafer rotating unit 700 may rotate the wafer supporting unit 500 by 90 degrees. As described above, according to the wafer level dispenser of the present embodiment, dispensing may be performed on various side surfaces of the semiconductor chips C while maintaining a tilt angle of the pump unit 100.

Meanwhile, by using the wafer level dispenser according to the present embodiment, also when dispensing a viscous liquid in a space between semiconductor chips C that are stacked in multiple layers, the viscous liquid may be applied by preventing smearing of the viscous liquid on unnecessary portions of the semiconductor chips C and also minimizing a KOZ.

When several semiconductor chips C are stacked and there is a protrusion on a side surface of the semiconductor chips C, the viscous liquid may not be applied to a portion under the protrusion by moving the nozzle 160 in a vertical direction as in the prior art. However, according to the wafer level dispenser of the present embodiment, a viscous liquid may be applied by modifying an angle of the nozzle 160, and thus, the viscous liquid may also be dispensed to a space under the protrusion by easily making the nozzle 160 approach the space.

When dispensing on the semiconductor chips C present on the wafer S is completed, the wafer S is returned. Returning of the wafer S is performed in a reverse order to loading the wafer S. First, the wafer transporting unit 600 transports the wafer supporting unit 500 to a position to which the wafer S is to be returned. The pressurization operating members 532 of the wafer pressurizing unit 530 raise the pressurizing members 531 with respect to the wafer S, and move the pressurizing members 531 backward in a radial direction with respect to the ring frame 510. The lifting members of the wafer supporting unit 500 raise the wafer supporting members 520 with respect to the ring frame 510. The wafer transporting apparatus catches the wafer S lifted by the wafer supporting members 520 to return the wafer S.

While the wafer level dispenser according to the present disclosure has been described with reference to preferred embodiments, the scope of the present disclosure is not limited to the above described and illustrated structures.

For example, while the pump unit 100 is described as a piezoelectric pump including the first and second piezoelectric actuators 110 and 120, a pump unit may also be configured using a piezoelectric pump including one piezoelectric actuator. According to circumstances, another type of pump different from a piezoelectric pump may also be used to configure a pump unit.

In addition, while the tilt unit 200 is described to rotate the pump unit 100 about a rotational axis that is parallel to a direction in which the first and second piezoelectric actuators 110 and 120 are arranged, a direction of a rotational axis about which a tilt unit rotates a pump unit may be modified in various manners. Also, a coupling relation between a tilt unit, a pump proceeding unit, and a pump unit may be modified in various manners. For example, a pump proceeding unit, a tilt unit, and a pump unit may be configured such that they are coupled in an order of a pump proceeding unit, a tilt unit, and a pump unit.

In addition, while a wafer level dispenser including the pump proceeding unit 300 is described above as an example, the wafer level dispenser according to the present disclosure may also be configured by omitting the pump proceeding unit.

In addition, while the pump transporting unit 400 is described as transporting the pump unit 100 in a Y-direction and a Z-direction, a pump transporting unit may also be configured to transport a pump unit in an X-direction.

In addition, while the wafer supporting unit 500 is described as including the ring frame 510 having a ring shape, a wafer supporting unit may also be configured to support a wafer S by using a frame having other various shapes.

In addition, while the wafer supporting members 520 protruding toward a center of the wafer supporting unit 500 and supporting edges of the wafer S are described above, the wafer S may also be supported using components having other various shapes.

In addition, while it is described above that the adsorption holes are formed in the wafer supporting members 520 and the heating block 540 of the wafer supporting unit 500 to vacuum-adsorb the wafer S to fix the wafer S, the adsorption holes may also be omitted.

In addition, while the wafer supporting members 520 of the wafer supporting unit 500 is described as being lifted by using the lifting members, the components may also be configured in a reverse manner. That is, a wafer supporting member may be fixed, and a lifting member may be configured to lift a ring frame with respect to the wafer supporting member. According to circumstances, a wafer supporting member and a ring frame may be integrally configured, and the ring frame and the wafer supporting member may be lifted together by using a lifting member. Also, a wafer level dispenser according to the present disclosure may be configured by omitting a lifting member.

In addition, while the wafer pressurizing unit 530 including the pressurizing members 531 and the pressurization operating members 532 is described above, a wafer pressurizing unit may also be configured using other various components for pressurizing a wafer S. According to circumstances, a wafer level dispenser according to the present disclosure may be configured by omitting a wafer pressurizing unit.

Also, while three pressurizing members 531 and three pressurization operating members 532 included in the wafer pressurizing unit 530 are described above, the number of pressurizing members and pressurizing operating members may be modified in various members.

Also, while the heating block 540 is described above as being included within the ring frame 510, a position where a heating block is placed may be modified in various manners. According to circumstances, a wafer level dispenser according to the present disclosure may be configured by omitting a heating block.

According to the wafer level dispenser of the present disclosure, a viscous liquid may be dispensed to a wafer or a semiconductor chip mounted on the wafer by adjusting an angle of a pump as desired.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. A wafer level dispenser comprising:
   a pumping device dispensing a viscous liquid, wherein the pumping device comprises a nozzle;
   a tilting device that is coupled to the pumping device to adjust an angle of a direction, in which the viscous liquid dispensed using the pumping device is discharged, and rotates the pumping device about a horizontal axis, wherein the tilting device comprises a surface;
   a pump transporting device coupled to the tilting device and transporting the tilting device, wherein the pump transporting device comprises a surface;
   a wafer supporting device placed below the pumping device and supporting a wafer, wherein the wafer supporting device comprises a ring frame; and
   a wafer rotating device rotating the wafer supporting device to adjust a direction of the wafer supported by the wafer supporting device, wherein the wafer rotating device comprises an axis.

2. The wafer level dispenser of claim 1, further comprising a wafer transporting device transporting the wafer supporting device in a horizontal direction to adjust a position of the wafer supporting device with respect to the pumping device, wherein the wafer transporting device comprises a surface.

3. The wafer level dispenser of claim 2, wherein the wafer transporting device moves forward or backward the wafer supporting device in a horizontal direction along a straight path, and
the pump transporting device transports the pumping device in a horizontal direction and a vertical direction that are orthogonal to a transporting direction of the wafer supporting device.

4. The wafer level dispenser of claim 1, further comprising a heating block that is in contact with a lower surface of a wafer held on the wafer supporting device and maintains a temperature of the wafer.

5. The wafer level dispenser of claim 4, wherein the ring frame of the wafer supporting device has a ring shape and supports edges of a wafer having a disk shape, and
wherein the heating block is placed within the ring frame of the wafer supporting device.

6. The wafer level dispenser of claim 5, further comprising a wafer pressurizing device pressurizing the wafer against the heating block to prevent warpage of the wafer held on the wafer supporting device, wherein the wafer pressurizing device comprises a surface.

7. The wafer level dispenser of claim 6, further comprising a pump proceeding device that is mounted at the tilting device and moves the pumping device forward or backward with respect to the tilting device in a discharging direction of a viscous liquid dispensed using the pumping device, wherein the pump proceeding device comprises a surface.

8. The wafer level dispenser of claim 6, wherein the wafer pressurizing device comprises:
a plurality of pressurizing devices arranged in a circumferential direction of the ring frame of the wafer supporting device, wherein each of the pressurizing devices comprises a surface; and
a plurality of pressurization operating devices respectively transporting the plurality of pressurizing devices in a radial direction with respect to the ring frame and respectively lifting the pressurizing devices with respect to the ring frame, wherein each of the pressurization operating devices comprises a surface.

9. The wafer level dispenser of claim 8, wherein the wafer supporting device further comprises a plurality of wafer supporting devices configured to adsorb a lower surface of the wafer and arranged along a circumferential direction of the ring frame, wherein each of the wafer supporting devices comprises a surface.

10. The wafer level dispenser of claim 4, wherein the pumping device comprises a piezoelectric pump dispensing a viscous liquid by using a piezoelectric actuator.

11. The wafer level dispenser of claim 10, wherein the pumping device comprises at least one piezoelectric actuator having a length that is varied according to an applied voltage, a lever that is placed to contact the at least one piezoelectric actuator and rotates according to a variation in the length of the at least one piezoelectric actuator, a valve rod connected to the lever to move forward or backward according to rotation of the lever, a reservoir, into which the valve rod is inserted, and which moves forward or backward and stores the viscous liquid, and a nozzle connected to the reservoir, wherein the viscous liquid is discharged through the nozzle.

12. The wafer level dispenser of claim 11, wherein the pumping device comprises two piezoelectric actuators,
wherein the two piezoelectric actuators are arranged on both sides with respect to a rotational axis of the lever, and
the tilting device rotates the pumping device about a rotational axis that is parallel to a direction in which the two piezoelectric actuators are arranged.

* * * * *